(12) United States Patent
Hu et al.

(10) Patent No.: US 11,609,446 B2
(45) Date of Patent: Mar. 21, 2023

(54) ELECTRONIC DEVICE AND MIDDLE FRAME THEREOF

(71) Applicant: BEIJING XIAOMI MOBILE SOFTWARE CO., LTD., Beijing (CN)

(72) Inventors: Xiankun Hu, Beijing (CN); Chunjie Lou, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 330 days.

(21) Appl. No.: 16/901,291

(22) Filed: Jun. 15, 2020

(65) Prior Publication Data

US 2021/0157198 A1 May 27, 2021

(30) Foreign Application Priority Data

Nov. 27, 2019 (CN) .......................... 201911184293.2

(51) Int. Cl.
| | | |
|---|---|---|
| *G02F 1/1333* | (2006.01) | |
| *H05K 1/02* | (2006.01) | |
| *H05K 5/00* | (2006.01) | |
| *H05K 5/03* | (2006.01) | |

(52) U.S. Cl.
CPC .... *G02F 1/133308* (2013.01); *G02F 1/13338* (2013.01); *H05K 1/0277* (2013.01); *H05K 5/0017* (2013.01); *H05K 5/03* (2013.01); *G02F 1/133317* (2021.01)

(58) Field of Classification Search
CPC .......... G02F 1/133308; G02F 1/13338; G02F 1/133317; H05K 1/0277; H05K 5/0017; H05K 5/03; G06V 40/1318; G06F 1/1626; G06F 1/1658; H04M 1/0266; H04M 2250/12; H04M 1/026
See application file for complete search history.

(56) References Cited

U.S. PATENT DOCUMENTS

| | | | |
|---|---|---|---|
| 2013/0107157 A1* | 5/2013 | Yang | G02F 1/133308 349/58 |
| 2017/0005147 A1* | 1/2017 | Lee | H01L 35/32 |
| 2017/0024599 A1* | 1/2017 | Lai | G06V 40/1318 |
| 2017/0068041 A1* | 3/2017 | Lai | G02B 6/0083 |

(Continued)

FOREIGN PATENT DOCUMENTS

| | | |
|---|---|---|
| CN | 205230077 U | 5/2016 |
| CN | 110070799 A | 7/2019 |

(Continued)

OTHER PUBLICATIONS

Extended European Search Report of counterpart EP Application No. 20188420.2 dated Feb. 9, 2021, (6p).

(Continued)

*Primary Examiner* — Steven T Sawyer
(74) *Attorney, Agent, or Firm* — Arch & Lake LLP (57) ABSTRACT

An electronic device and a middle frame thereof are provided. The middle frame includes a supporting frame. The supporting frame is provided with a supporting surface configured to support an edge area of a transparent cover plate of the electronic device, and an inner sidewall connected to the supporting surface. A groove for receiving a light source of an under-screen fingerprint recognition circuit is disposed in the inner sidewall and connected to the supporting surface.

17 Claims, 7 Drawing Sheets

(56) References Cited

U.S. PATENT DOCUMENTS

2017/0235995 A1* 8/2017 Han .................. G06V 10/141
                                                382/124
2018/0365472 A1* 12/2018 Cai ................... G02B 13/0025
2021/0124199 A1* 4/2021 Qing ................ G02F 1/133317
2021/0409527 A1* 12/2021 Li ..................... H04M 1/0249

FOREIGN PATENT DOCUMENTS

| CN | 110298324 A | 10/2019 |
|----|-------------|---------|
| CN | 110376780 A | 10/2019 |
| EP | 3328039 A1 | 5/2018 |
| KR | 20150104506 A | 9/2015 |

OTHER PUBLICATIONS

China National Intellectual Property Administration, First office action of Chinese application No. 201911184293.2 dated Sep. 14, 2022, which is foreign counterpart application of this US application, (25p).

* cited by examiner

ELECTRONIC DEVICE AND MIDDLE FRAME THEREOF

CROSS-REFERENCE TO RELATED APPLICATION

This application claims priority to Chinese Patent Application 201911184293.2, filed Nov. 27, 2019, the entire contents of which are incorporated herein by reference.

TECHNICAL FIELD

The present disclosure relates to the field of mobile terminal technologies, and in particular to an electronic device and a middle frame thereof.

BACKGROUND

As a portion constituting an external structure of an electronic device, a housing is a structure that a user can directly touch, and mainly plays a protective role. The housing of the electronic device usually includes a middle frame. Taking a common electronic device, such as a mobile phone, as an example, its middle frame is a portion in the housing which constitutes a side face of the mobile phone. A transparent cover plate is usually installed on one side of the middle frame, and a back cover is installed on the other side of the middle frame, to form a cavity in which structures, e.g., a display module and a battery, are located.

The under-screen fingerprint technology is a technology that enables an electronic device to respond to a user's fingerprint by imbedding an under-screen fingerprint recognition circuit in the electronic device. The under-screen fingerprint recognition circuit includes a light source and a receiver. Light emitted by the light source is reflected onto the receiver when a user's finger touches a corresponding area on a screen. Thus, information relevant to the fingerprint is acquired based on the reflected light.

SUMMARY

Embodiments of the present disclosure provide an electronic device and a middle frame thereof, which is benefit for increasing a screen-to-body ratio of the electronic device. The technical solutions are as follows.

According to the first aspect of the present disclosure, a middle frame of an electronic device is provided. The middle frame comprises a supporting frame, where the supporting frame is provided with a supporting surface configured to support an edge area of a transparent cover plate of the electronic device, and an inner sidewall connected to the supporting surface, and a groove for receiving a light source of an under-screen fingerprint recognition circuit is disposed in the inner sidewall and connected to the supporting surface.

According to a second aspect of the embodiments of the present disclosure, an electronic device comprising the middle frame is further provided.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," and the like may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

The receiver is usually disposed on the back side of the display. In some electronic devices, the light sources are arranged near the middle frames, and the light sources and the display are arranged side by side. There should be a space that big enough to place the light source between the display and an inner sidewall of the middle frame, which will reduce a screen-to-body ratio of the electronic device.

Figure 1:
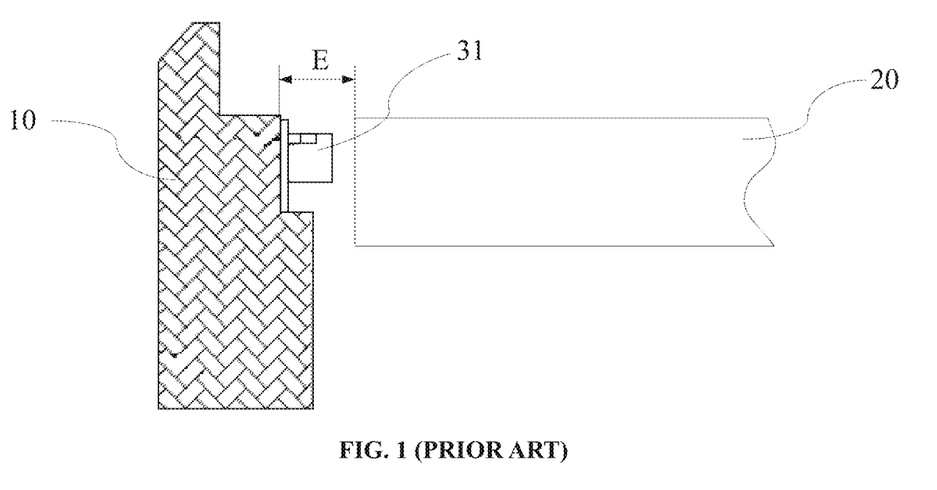
FIG. 1 is a schematic diagram showing a local structure of an electronic device in the related art.
Figure 2:
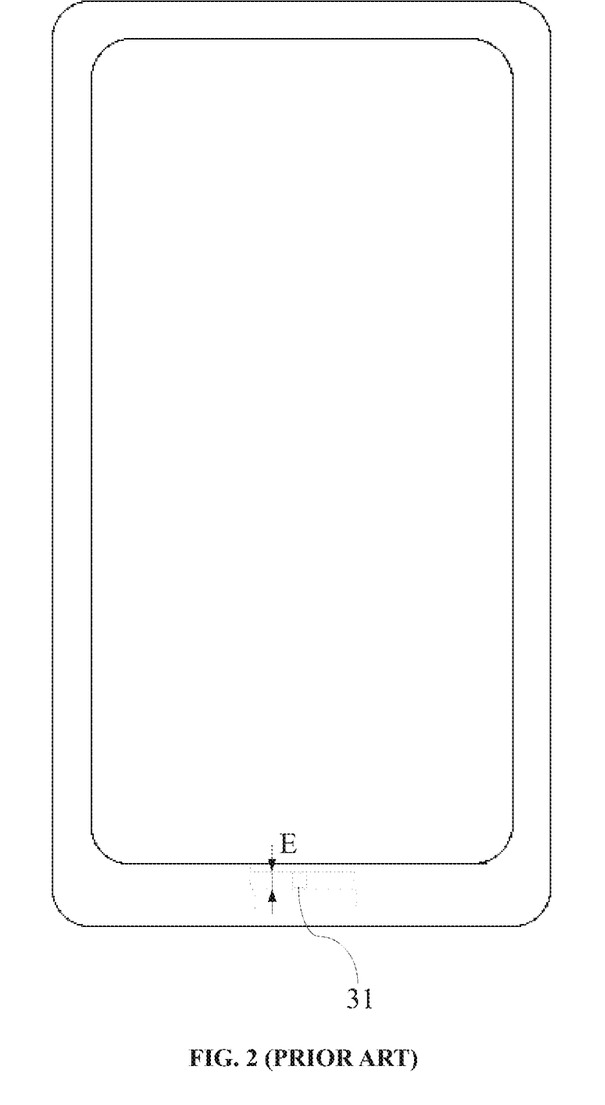
FIG. 2 is a front view of the electronic device shown in FIG. 1.

FIG. 1 is a schematic diagram showing a local structure of an electronic device in the related art. As shown in FIG. 1, the electronic device includes a middle frame 10, a display 20, and an under-screen fingerprint recognition circuit. A light source 31 of the under-screen fingerprint recognition circuit and the display 20 are arranged side by side. The light source 31 is sandwiched between an inner sidewall of the middle frame 10 and the display 20. In order to install the light source 31, a relatively larger gap E is reserved between the display module 20 and the middle frame 10. FIG. 2 is a front view of the electronic device shown in FIG. 1. As shown in FIG. 2, owing to the relatively larger gap E, the size of the display 20 will be limited on the premise of keeping the size of the middle frame 10 unchanged. As result, a screen-to-body ratio of the electronic device is reduced. Since the groove for receiving the light source of the under-screen fingerprint recognition circuit is disposed in the inner sidewall, the light source of the under-screen fingerprint recognition circuit can be disposed in the groove connected to the supporting surface, and further, light emitted by the light source can certainly strike the transparent cover plate.

Figure 3:
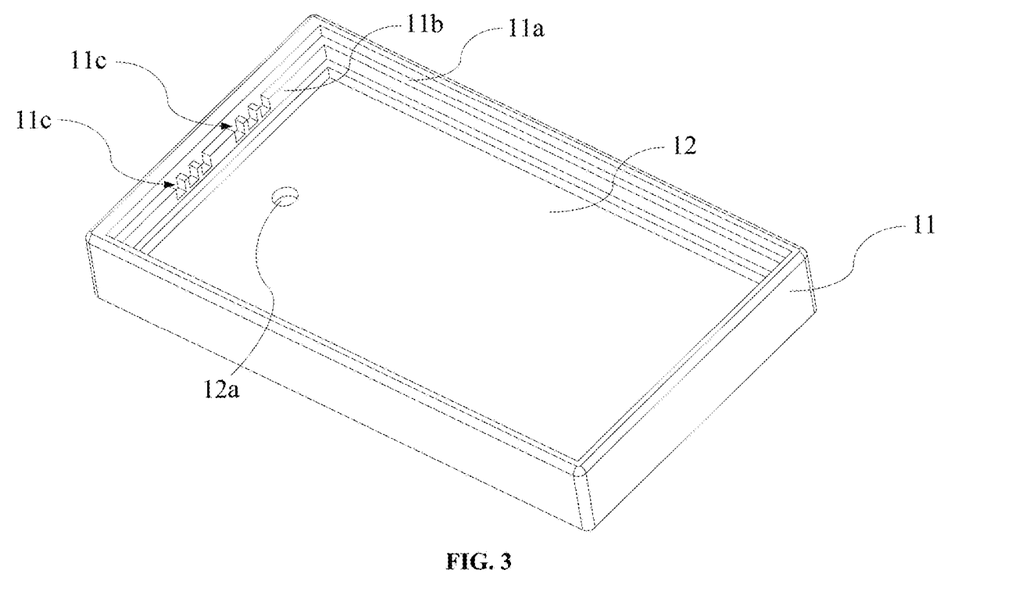
FIG. 3 is a schematic structural diagram of a middle frame of an electronic device in accordance with an embodiment of the present disclosure.
Figure 4:
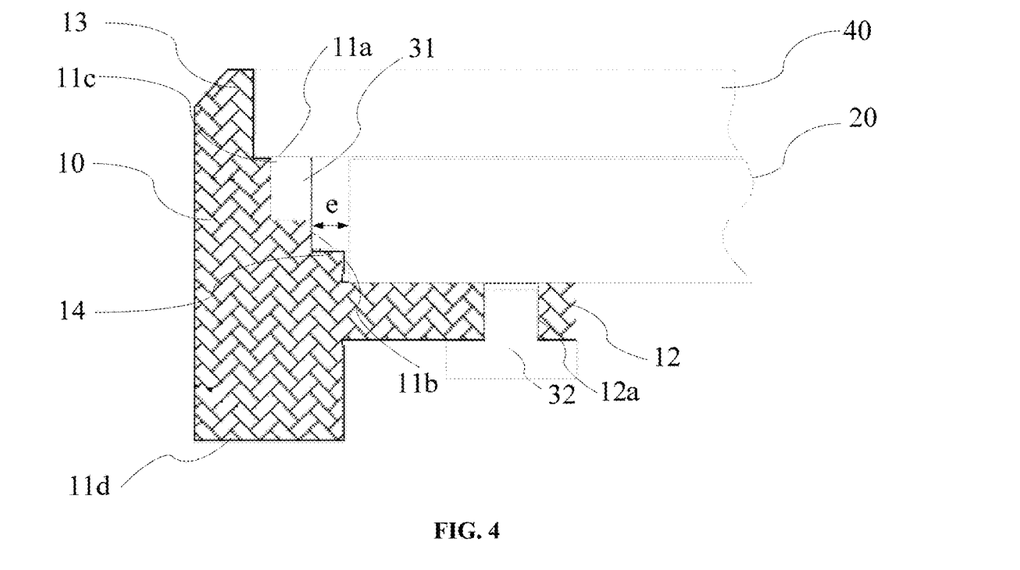
FIG. 4 is a local sectional view of FIG. 3.

FIG. 3 is a schematic structural diagram of a middle frame of an electronic device in accordance with an embodiment of the present disclosure. The electronic device is for example a mobile phone. As shown in FIG. 3, the middle frame 10 includes a supporting frame 11. FIG. 4 is a local sectional view of FIG. 3. As shown in FIG. 4, the supporting frame 11 is provided with a supporting surface 11a configured to support an edge area of a transparent cover plate 40 of the electronic device, and an inner sidewall 11b connected to the supporting surface 11a. The inner sidewall 11b is configured to surround the display 20 of the electronic device.

As shown in FIG. 3, a groove 11c for accommodating the light source 31 of the under-screen fingerprint recognition circuit is disposed in the inner sidewall 11b and connected to the supporting surface 11a.

The transparent cover plate can be supported by the supporting surface of the supporting frame of the middle frame. The inner sidewall of the supporting frame is configured to surround the display so as to accommodate the display. Since the groove for accommodating the light source of the under-screen fingerprint recognition circuit is disposed in the inner sidewall, the light source of the under-screen fingerprint recognition circuit can be disposed in the groove connected to the supporting surface, and further, light emitted by the light source can certainly strike the transparent cover plate. Since the light source of the under-screen fingerprint recognition circuit is disposed in the groove, a gap e between a display and the inner sidewall can be reduced. A display with a larger area can be placed on the premise of keeping the size of the middle frame unchanged. Thus, a screen-to-body ratio of the electronic device is advantageously increased.

As shown in FIG. 3, there may be a plurality of grooves 11c arranged at intervals. Generally, the under-screen fingerprint recognition circuit includes a plurality of light sources 31, which may be arranged in the plurality of grooves 11c that arranged at intervals. Owing to the plurality of light sources 31, a receiver 32 may receive light reflected by a finger.

Optionally, the supporting frame 11 may take the shape of a rectangular frame. The plurality of grooves 11c may be located on the same side of the rectangular frame. Taking a mobile phone as an example, a fingerprint recognition area on a screen is usually close to a lower side of the screen. Therefore, the grooves 11c may be arranged at one edge, on the lower side of the screen, of the supporting frame 11.

As shown in FIG. 3, the plurality of grooves 11c may be symmetrically distributed about a midpoint of one edge of the rectangular frame. The fingerprint recognition area on the screen is usually located near the center of the lower side of the screen. Owing to the plurality of symmetrically arranged grooves 11c, the plurality of light sources 31 may also be symmetrically distributed to jointly illuminate the fingerprint recognition area on the screen, which helps the under-screen fingerprint recognition circuit acquire fingerprint information more accurately.

As shown in FIG. 4, the supporting frame 11 may further include a limiting rib 13 located on the supporting surface 11a. The limiting rib 13 and the supporting surface 11a constitute a spigot structure for limiting the transparent cover plate 40. During assembly of the electronic device, the transparent cover plate 40 is usually bonded to the supporting surface 11a. The limiting rib 13 can limit the transparent cover plate 40, such that the transparent cover plate 40 is in a more accurate position and is prevented from looseness. In addition, the limiting rib 13 may also provide a surface to be bonded to the transparent cover plate 40. During installation of the transparent cover plate 40, the transparent cover plate 40 is bonded to the limiting rib 13, in order to make the transparent cover plate 40 firmer.

As shown in FIG. 4, a limiting boss 14 for limiting the flexible circuit board connected to the light source 31 is further disposed on the inner sidewall 11b. In a direction perpendicular to the supporting surface 11a, the limiting boss 14 is located between a surface (for example, a surface 11d in FIG. 4), opposite to the supporting surface 11a, of the supporting frame 11 and the groove 11c. During installation of the light source 31, the flexible circuit board connected to the light source 31 is located outside the groove 11c, and is usually secured to the inner sidewall 11b, for example, by means of bonding. Owing to the limiting boss 14, the flexible circuit board may be limited by the limiting boss 13 when secured to the inner sidewall 11b, which facilitates installation of the flexible circuit board.

A height of the limiting boss 14 may be equal to a thickness of the flexible circuit board. In this way, not only may limiting be provided, but also the limiting boss 14 may not be too high. Thus, installation of other structures inside the electronic device will not be affected.

As shown in FIG. 4, the middle frame 10 may further include a supporting plate 12 for supporting a display. The supporting plate 12 is connected to the inner sidewall 11b of the supporting frame 11. A light-transmitting hole 12a for cooperating with the receiver 32 of the under-screen fingerprint recognition circuit is disposed in the supporting plate 12. The display 20 can be supported by the supporting plate 12. Light emitted by the light source 31 of the under-screen fingerprint recognition circuit is reflected by the finger, passes through the display 20, and then, passes through the supporting plate 12 via the light-transmitting hole 12a, so as to reach the receiver 32 of the under-screen fingerprint recognition circuit.

As shown in FIG. 4, the supporting plate 12 may be connected to the inner sidewall 11b of the supporting frame 11 by the limiting boss 14. In another possible implementation mode of the present disclosure, the supporting plate 12 may also be directly connected to the inner sidewall 11b. The limiting boss 14 is located on the side, close to the supporting surface 11a, of the supporting plate 12 if the supporting plate 12 is directly connected to the inner sidewall 11b.

Figure 5:
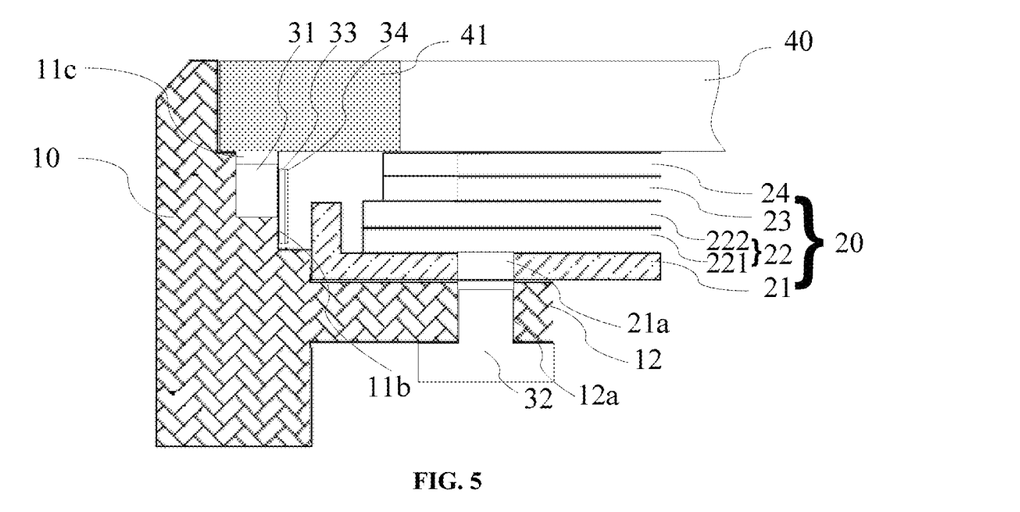
FIG. 5 is a schematic diagram showing a local structure of an electronic device in accordance with an embodiment of the present disclosure.

FIG. 5 is a schematic diagram showing a local structure of an electronic device in accordance with an embodiment of the present disclosure. As shown in FIG. 5, the electronic device includes the middle frame 10 as shown in FIG. 1. The electronic device may be an electronic device with a middle frame, e.g., a mobile phone, a tablet computer, a television, a notebook computer, a digital photo frame or a navigator.

The electronic device may include the display 20, and the display 20 may include a liquid crystal display module or an OLED (Organic Light Emitting Diode) display module. The display 20 is located in a space surrounded by the inner sidewall 11b and is provided with a side surface opposite to the groove 11c. An orthographic projection of the groove 11c on the side surface at least partially overlaps the display 20. That is, the display 20 and the light source 31 of the under-screen fingerprint recognition circuit are arranged side by side.

The present disclosure takes a liquid crystal display as an example. As shown in FIG. 5, the liquid crystal display may include a backlight framework 21, a backlight source 22, a liquid crystal cell 23, and a color filter 24. The backlight source 22 is mounted in the backlight framework 21. The liquid crystal cell 23 is located on the backlight source 22. The color filter 24 is located on the liquid crystal cell 23. The backlight framework 21 may have an opening 21a, such that the light emitted by the light source 31 of the under-screen fingerprint recognition circuit can pass through the display 20 after being reflected by the finger.

The backlight framework 21 is generally made of a metal material, and is therefore also called a backlight iron frame. The metallic backlight framework 21 has not only high strength but also favorable thermal conductivity, and thus, facilitates heat dissipation.

The backlight source 22 may include a light guide plate 221 and an optical film 222. The optical film 222 may be located between the light guide plate 221 and the liquid crystal cell 23. Here, the optical film 222 at least may include at least one of a diffusion sheet and a prism sheet.

As shown in FIG. 5, the electronic device may further include a transparent cover plate 40 and an under-screen fingerprint recognition circuit. The transparent cover plate 40 is located on the supporting surface 11a. The light source 31 of the under-screen fingerprint recognition circuit is located in the groove 11c. The light source 31 emits light toward the transparent cover plate 40. The transparent cover plate 40 can protect the electronic device and avoid damages to internal components of the electronic device. The light source 31 emits the light toward one side of the transparent cover plate 40 side, such that the light can successfully strike the finger to be reflected.

As shown in FIG. 5, a light-shielding area 41 capable of shielding visible light may be disposed at an edge of the transparent cover plate 40. An orthographic projection of the light source 31 on the transparent cover plate 40 is located in the light-shielding area 41. The light source 31 is an infrared light source, for example, an infrared LED. The light-shielding area 41 disposed on the edge of the transparent cover plate 40 can shield part of the interior of the electronic device. For example, the light-shielding area 41 can shield the light source 31 to prevent a user from observing the light source 31 from the outside of the electronic device. Since the light source 31 is an infrared light source, it will not be shielded by the light-shielding area 41. Furthermore, owing to the infrared light source, the user will not be aware of the existence of the light source 31 visually even if the light source 31 is in a light-emitting status.

Figure 6:
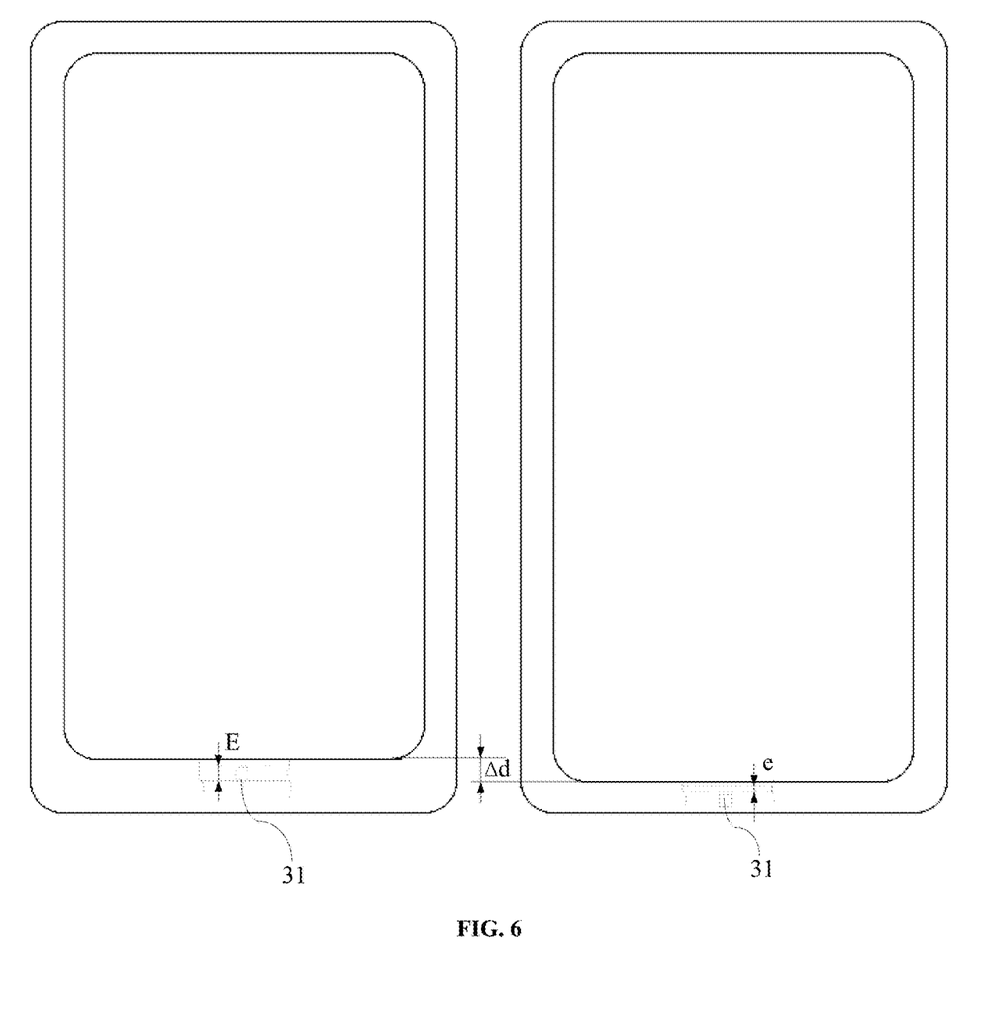
FIG. 6 is a comparison diagram of an electronic device provided by an embodiment of the present disclosure and an electronic device in the related art.

Generally, the light-shielding area 41 extends inwards from the edge of the transparent cover plate 40 to overlap an edge of the color filter 24 of the display 20 so as to provide an excellent shielding effect. FIG. 6 is a comparison diagram of an electronic device provided by an embodiment of the present disclosure and an electronic device in the related art. On the right side of FIG. 6 is the electronic device provided by the embodiment of the present disclosure. As shown in FIG. 6, in the related art, since there should be a gap between the display 20 and the middle frame 10 that is big enough to place the light source 31 of the under-screen fingerprint recognition circuit, a distance E between the display 20 and the inner sidewall 11b of the middle frame 10 is relatively large, and the light-shielding area 41 needs to be relatively large. In the embodiment of the present disclosure, since the light source 31 of the under-screen fingerprint recognition circuit is located in the groove 11c, the distance e between the display 20 and the inner sidewall 11b of the middle frame 10 is relatively large. Thus, a width of the light-shielding area 41 can be reduced by Δd to help increase a screen-to-body ratio. Generally, the size of the light source 31 in a direction perpendicular to the inner sidewall 11b is 1 mm to 1.2 mm. The width of the light-shielding area 41 can be reduced by 1 mm to 1.2 mm when the light source 31 is placed in the groove 11c.

Figure 7:
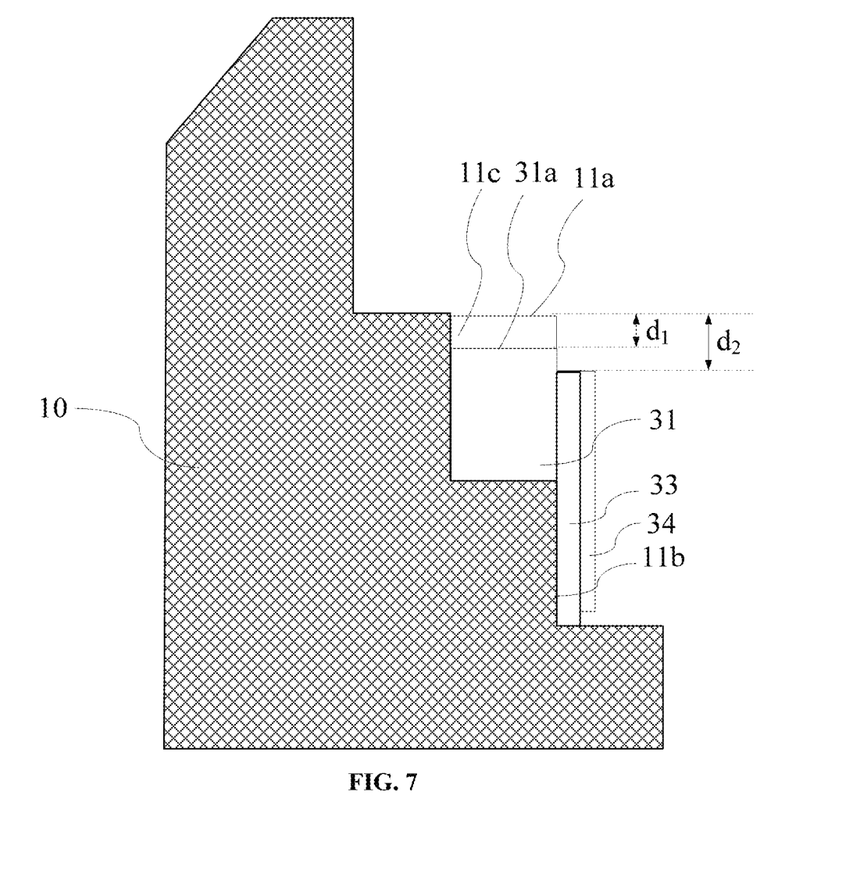
FIG. 7 is a schematic diagram showing a local structure of an electronic device in accordance with an embodiment of the present disclosure.

FIG. 7 is a schematic diagram showing a local structure of an electronic device in accordance with an embodiment of the present disclosure. As shown in FIG. 7, the light source 31 is located on one side of the supporting surface 11a and a distance $d_1$ between the light source 31 and the supporting surface 11a may be 0.1 mm to 0.2 mm. The light source 31 is not higher than the supporting surface 11a in the vertical direction shown in the FIG. 7. Since the transparent cover plate 40 has to be attached onto the supporting surface 11a of the supporting frame 11 during installation, a certain gap is reserved between the light source 31 and the supporting surface 11a, which may avoid interference between the light source 31 and the transparent cover plate 40. The light source 31 is provided with a light-emitting surface 31a, and the light-emitting surface 31a faces the transparent cover plate 40 to enable the light emitted by the light source 31 to strike the transparent cover 40. In case of an excessively small distance, the light-emitting surface 31a of the light source 31 may contact the transparent cover plate 40 and thus may be damaged by extrusion when the electronic device is affected by thermal expansion and contraction or slightly deformed. However, an excessively large distance is not conducive to reducing the thickness of the electronic device.

As shown in FIG. 7, the under-screen fingerprint recognition circuit may further include a flexible circuit board 33. The light source 31 may be connected to the flexible circuit board 33. The flexible circuit board 33 is attached onto the inner sidewall 11b, and can supply power for the light source 31 and control the light source 31 to emit light. Attaching the flexible circuit board 33 onto the inner side wall 11b is conductive to reducing a space occupied by the flexible circuit board 33. Further, the distance between the display 20 and the inner sidewall 11b of the middle frame 10 is reduced, such that the light-shielding area 41 is reduced to help increase the screen-to-body ratio.

Optionally, a reinforcing sheet 34 may be disposed on a surface, away from the inner sidewall 11b, of the flexible circuit board 33. The reinforcing sheet 34 can improve the strength of the flexible circuit board 33 and facilitate installation of the light source 31 on the flexible circuit board 33.

The reinforcing sheet 34 may be made from such materials as PI (Polyimide) and PET (polyethylene glycol terephthalate), and may be bonded to the flexible circuit board 33.

Figure 8:
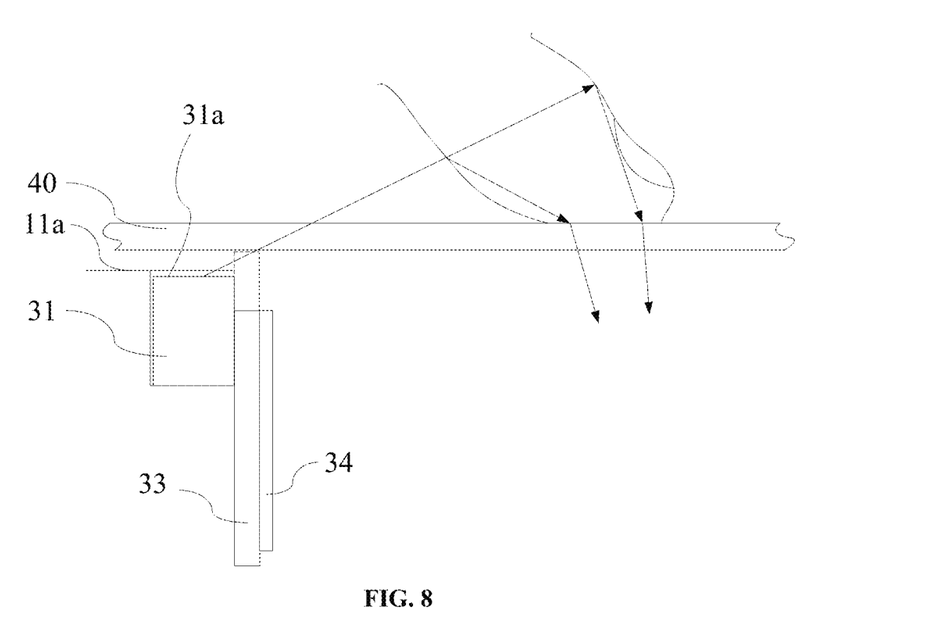
FIG. 8 is an optical path diagram of an under-screen fingerprint recognition circuit in accordance with an embodiment of the present disclosure.

As shown in FIG. 7, the distance $d_1$ between the light-emitting surface 31a of the light source 31 and the supporting surface 11a may not be greater than a distance $d_2$ between the flexible circuit board 33 and the supporting surface 11a. In this way, the distance between the light-emitting surface 31a and the transparent cover plate 40 is not greater than the distance between the flexible circuit board 33 and the transparent cover plate 40 after the transparent cover plate 40 and the middle frame 10 are assembled, such that the flexible circuit board 33 may not come into contact with the transparent cover plate 40. FIG. 8 is an optical path diagram of an under-screen fingerprint recognition circuit in accordance with an embodiment of the present disclosure. As shown in FIG. 8, light emitted by the light-emitting surface 31a of the light source 31 can be reflected back into the electronic device under the action of the finger. The rectangular frame portion delimited by the dotted line in FIG. 8 is an upper end of the flexible circuit board 33 in the related art. It can be seen from the optical path diagram that with the design in the present disclosure, the flexible circuit board 33 can be prevented from shielding the light emitted by the light source 31.

Figure 9:
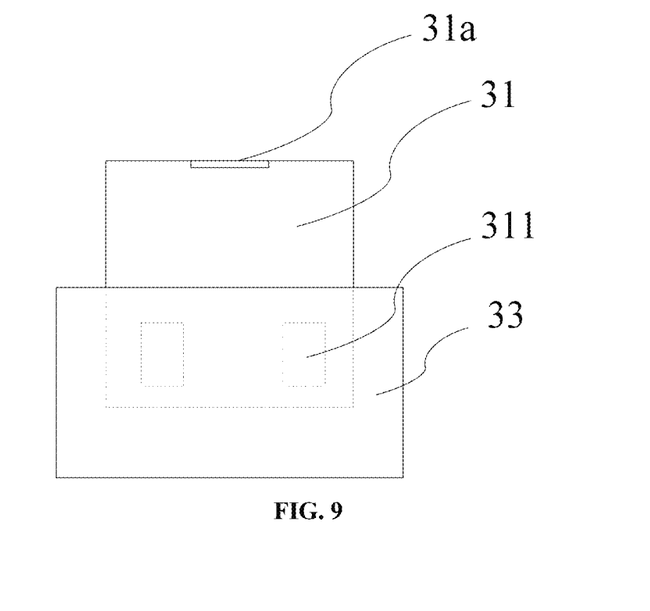
FIG. 9 is a schematic structural diagram of a light source of an under-screen fingerprint recognition circuit in accordance with an embodiment of the present disclosure.

FIG. 9 is a schematic structural diagram of a light source of an under-screen fingerprint recognition circuit in accordance with an embodiment of the present disclosure. As shown in FIG. 9, a pad 311 is disposed on the light source 31. The light source 31 is welded to the flexible circuit board 33 by the pad 311. An orthographic projection of the light-emitting surface 31a of the light source 31 on the flexible circuit board 33 may be located outside the flexible circuit board 33, such that the distance between the light-emitting surface 31a of the light source 31 and the transparent cover plate 40 may not be greater than the distance between the flexible circuit board 33 and the transparent cover plate 40 after the light source 31 and the flexible circuit board 33 are mounted on the middle frame 10.

The present disclosure may include dedicated hardware implementations such as application specific integrated circuits, programmable logic arrays and other hardware devices. The hardware implementations can be constructed to implement one or more of the methods described herein. Applications that may include the apparatus and systems of various examples can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, with a true scope and spirit of the present disclosure is indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A middle frame of an electronic device, comprising:
   a supporting frame provided with a supporting surface configured to support an edge area of a transparent cover plate of the electronic device;
   an inner sidewall connected to the supporting surface; and
   at least one groove disposed in the inner sidewall and connected to the supporting surface, the at least one groove being configured for receiving a light source of an under-screen fingerprint recognition circuit,
   wherein the under-screen fingerprint recognition circuit further comprises a flexible circuit board, the light source is connected to the flexible circuit board, the flexible circuit board is located outside the groove, the flexible circuit board is attached onto the inner sidewall, the light source is provided with a light-emitting surface that faces the transparent cover plate, an orthographic projection of the light-emitting surface on the flexible circuit board is located outside the flexible circuit board, and a distance between the light-emitting surface and the transparent cover plate is not greater than a distance between the flexible circuit board and the transparent cover plate.

2. The middle frame according to claim 1, wherein the at least one groove comprises a plurality of grooves arranged at intervals.

3. The middle frame according to claim 2, wherein the supporting frame takes the shape of a rectangular frame, and the plurality of grooves are located on a same side of the rectangular frame.

4. The middle frame according to claim 3, wherein the plurality of grooves are symmetrically distributed about a midpoint of one side of the rectangular frame.

5. The middle frame according to claim 1, further comprising a supporting plate configured to support a display of the electronic device and connected to the inner sidewall, wherein a light-transmitting hole configured to cooperate with a receiver of the under-screen fingerprint recognition circuit is disposed in the supporting plate.

6. The middle frame according to claim 1, wherein the supporting frame comprises a limiting rib located on the supporting surface, and the limiting rib and the supporting surface constitute a spigot structure for limiting the transparent cover plate.

7. The middle frame according to claim 1, wherein a limiting boss for limiting a flexible circuit board connected to the light source is disposed on the inner sidewall, and in a direction perpendicular to the supporting surface, the limiting boss is located between a surface, opposite to the supporting surface, of the supporting frame and the groove.

8. An electronic device, comprising a middle frame that comprises:
   a supporting frame provided with a supporting surface configured to support an edge area of a transparent cover plate of the electronic device;
   an inner sidewall connected to the supporting surface; and
   at least one groove disposed in the inner sidewall and connected to the supporting surface, the at least one groove being configured for receiving a light source of an under-screen fingerprint recognition circuit,
   wherein the under-screen fingerprint recognition circuit further comprises a flexible circuit board, the light source is connected to the flexible circuit board, the flexible circuit board is located outside the groove, the flexible circuit board is attached onto the inner sidewall, the light source is provided with a light-emitting surface that faces the transparent cover plate, an orthographic projection of the light-emitting surface on the flexible circuit board is located outside the flexible circuit board, and a distance between the light-emitting surface and the transparent cover plate is not greater than a distance between the flexible circuit board and the transparent cover plate.

9. The electronic device according to claim 8, wherein the at least one groove comprises a plurality of grooves arranged at intervals.

10. The electronic device according to claim 9, wherein the supporting frame takes the shape of a rectangular frame, and the plurality of grooves are located on a same side of the rectangular frame.

11. The electronic device according to claim 10, wherein the plurality of grooves are symmetrically distributed about a midpoint of one side of the rectangular frame.

12. The electronic device according to claim 8, wherein the middle frame further comprising a supporting plate configured to support a display of the electronic device and connected to the inner sidewall, wherein a light-transmitting hole configured to cooperate with a receiver of the under-screen fingerprint recognition circuit is disposed in the supporting plate.

13. The electronic device according to claim 8, wherein the supporting frame comprises a limiting rib located on the supporting surface, and the limiting rib and the supporting surface constitute a spigot structure for limiting the transparent cover plate.

14. The electronic device according to claim 8, wherein the light source emits light toward the transparent cover plate.

15. The electronic device according to claim 8, further comprising a reinforcing sheet that is disposed on a surface, away from the inner sidewall, of the flexible circuit board.

16. The electronic device according to claim 14, further comprising a light-shielding area capable of shielding visible light that is disposed at an edge of the transparent cover plate, wherein an orthographic projection of the light source on the transparent cover plate is located in the light-shielding area.

17. The electronic device according to claim 14, further comprising a display located in a space surrounded by an inner sidewall, wherein the display is provided with a side surface opposite to the groove, and an orthographic projection of the groove on the side surface at least partially overlaps the display.

* * * * *